(12) United States Patent
Weimer et al.

(10) Patent No.: US 12,080,894 B2
(45) Date of Patent: Sep. 3, 2024

(54) TUNGSTEN METAL/TUNGSTEN NITRIDE ENHANCED PLATINUM-BASED ORR CATALYST AND METHOD FOR MAKING THE SAME

(71) Applicant: THE REGENTS OF THE UNIVERSITY OF COLORADO, A BODY CORPORATE, Denver, CO (US)

(72) Inventors: Alan W. Weimer, Niwot, CO (US); William McNeary, Boulder, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 566 days.

(21) Appl. No.: 17/288,557

(22) PCT Filed: Oct. 25, 2019

(86) PCT No.: PCT/US2019/058208
§ 371 (c)(1),
(2) Date: Apr. 25, 2021

(87) PCT Pub. No.: WO2020/087036
PCT Pub. Date: Apr. 30, 2020

(65) Prior Publication Data
US 2021/0399310 A1    Dec. 23, 2021

Related U.S. Application Data

(60) Provisional application No. 62/751,518, filed on Oct. 26, 2018.

(51) Int. Cl.
*H01M 4/86*    (2006.01)
*C23C 16/06*    (2006.01)
(Continued)

(52) U.S. Cl.
CPC .......... *H01M 4/8663* (2013.01); *C23C 16/06* (2013.01); *C23C 16/34* (2013.01);
(Continued)

(58) Field of Classification Search
CPC ... B01J 21/18; B01J 23/38; B01J 23/40; B01J 23/42; B01J 23/44; B01J 23/46;
(Continued)

(56) References Cited

U.S. PATENT DOCUMENTS 7,691,749 B2    4/2010    Levy et al.
7,858,550 B2    12/2010   Dressick et al.
(Continued)

FOREIGN PATENT DOCUMENTS

CN    103041827 B    6/2015

OTHER PUBLICATIONS

Yang et al., "Mitigating the Degradation of Carbon-Supported Pt Electrocatalysts by Tungsten Oxide Nanoplates," Available online Dec. 2, 2015, Electrochimica Acta, 188, 529-536. (Year: 2015).*
(Continued)

*Primary Examiner* — Matthew W Van Oudenaren
(74) *Attorney, Agent, or Firm* — Snell & Wilmer L.L.P.

(57) ABSTRACT

A method for forming an oxygen reduction reaction (ORR) catalyst (200, 900) may include providing a carbon (210, 910) supported platinum nanoparticle (220, 920) substrate (Pt/C) (110) and applying a tungsten nitride (WN) film (940) onto the surface of the Pt/C substrate (210, 220, 910, 920) using atomic layer deposition (ALD) (120). The Pt/C substrate (210, 220, 910, 920) with the WN film (940) may then be oxidized at a low temperature (130) and annealed at a high temperature in order to reduce WN to metallic tungsten (W) (140). The metallic W forms a blocking layer (230, 930) over coarse Pt nanoparticles (220, 920) and improves the
(Continued)

activity and the durability of the Pt/C catalyst (900, 200) when used in fuel cells or related applications.

20 Claims, 9 Drawing Sheets

(51) Int. Cl.

| | | |
|---|---|---|
| C23C 16/34 | (2006.01) | |
| C23C 16/455 | (2006.01) | |
| C23C 16/56 | (2006.01) | |
| H01M 4/92 | (2006.01) | |
| H01M 8/10 | (2016.01) | |

(52) U.S. Cl.
CPC ........ *C23C 16/45555* (2013.01); *C23C 16/56* (2013.01); *H01M 4/926* (2013.01); *H01M 2008/1095* (2013.01)

(58) Field of Classification Search
CPC ...... B01J 23/462; B01J 23/464; B01J 23/466; B01J 23/468; B01J 23/652; B01J 23/6527; B01J 27/24; B01J 33/00
See application file for complete search history.

(56) References Cited

U.S. PATENT DOCUMENTS

| | | |
|---|---|---|
| 9,755,246 B2 | 9/2017 | Montaut et al. |
| 2006/0094238 A1 | 5/2006 | Levy et al. |
| 2008/0051281 A1 | 2/2008 | Dressick et al. |
| 2014/0295326 A1 | 10/2014 | Park et al. |

OTHER PUBLICATIONS

Fabrication and performance investigation of nanocrystal tungsten nitride supported Pt catalysts for methanol electrooxidation, 2013, New J. Chem. 37, 3976-3980. (Year: 2013).*

International Preliminary Report on Patentability from International Application No. PCT/US2019/058208 issued Apr. 27, 2021.
International Search Report and Written Opinion from International Application No. PCT/US2019/058208 mailed Jan. 13, 2020.
Machine translation of Description of Chinese Patent CN 103041827B.
Cheng, Niancai, et al., Extremely Stable Platinum Nanoparticles Encapsulated in a Zirconia Nanocage by Area-Selective Atomic Layer Deposition for the Oxygen Reduction Reaction, Advanced Materials, vol. 27, No. 2, Jan. 1, 2015, pp. 277-281, XP055947255, DE, ISSN: 0935-9648, DOI: 10.1002/adma.201404314.
Yan, Haijing, et al., Small-sized tungsten nitride anchoring into a 3D CNT-rGO framework as a superior bifunctional catalyst for the methanol oxidation and oxygen reduction reactions, Nano Research, Tsinghua University Press, CN, vol. 9, No. 2, Dec. 28, 2015, pp. 329-343, XP035783240, ISSN: 1998-0124, DOI: 10.1007/S12274-015-0912-X.
Marichy, Catherine, et al., ALD SnO2 protective decoration enhances the durability of a Pt based electrocatalyst, Journal of Materials Chemistry A, vol. 4, No. 3, Jan. 1, 2016, pp. 969-975, XP055947257, GB, ISSN: 2050-7488, DOI: 10.1039/C5TA08432F.
McNeary, W. Wilson, et al., Atomic layer deposition of TiO2 for stabilization of Pt nanoparticle oxygen reduction reaction catalysts, Journal of Applied Electrochemistry, Springer, Dordrecht, NL, vol. 48, No. 9, Jun. 14, 2018, pp. 973-984, XP036568221, ISSN: 0021-891X, DOI: 10.1007/S10800-018-1226-Y.
McNeary, W. Wilson, et al., Improved durability and activity of Pt/C catalysts through atomic layer deposition of tungsten nitride and subsequent thermal treatment, Applied Catalysis B. Environmental, vol. 254, May 8, 2019, pp. 587-593, XP085707508, ISSN: 0926-3373, DOI: 10.1016/J.APCATB.2019.05.036.
Extended European Search Report mailed Aug. 8, 2022 in corresponding European Application No. 19876661.0.
First Examination Report mailed Jan. 24, 2023 in corresponding Indian Application No. 202117018983.

* cited by examiner

TUNGSTEN METAL/TUNGSTEN NITRIDE ENHANCED PLATINUM-BASED ORR CATALYST AND METHOD FOR MAKING THE SAME

CROSS-REFERENCE TO RELATED APPLICATION

This application is a United States national stage filing under 35 U.S.C. § 371 based on International Application No. PCT/US2019/058208 and claims the benefit of priority from U.S. Provisional Patent Application Ser. No. 62/751,518, filed Oct. 26, 2018 and entitled TUNGSTEN METAL/TUNGSTEN NITRIDE OVERLAYS FOR PREVENTING CATALYST NANOPARTICLE SINTERING, which is are incorporated herein by reference in its their entirety.

Interest in new energy production and storage methods has increased dramatically in recent years, due to the limitations of hydrocarbon-based energy sources. Fuel cells convert chemical energy into electrical energy using electrochemical cells comprising two electrodes separated by an electrolyte. In operation, fuel such as hydrogen or an alcohol is supplied to the anode and an oxidant, such as oxygen or air, is supplied to the cathode. Electrochemical reactions occur at the electrodes, and the chemical energy of the fuel and the oxidant is converted to electrical energy and heat. Electrocatalysts are used to promote the electrochemical oxidation of the fuel at the anode and the electrochemical reduction of oxygen at the cathode, yet the electrocatalysts must ordinarily operate under strongly acidic conditions and the selection of catalysts is restricted by degradation problems.

The development of sufficiently active, durable, and cost-effective catalysts for the cathodic oxygen reduction reaction (ORR) is a major challenge in the commercialization of polymer electrolyte membrane fuel cells (PEMFCs). It has been known that carbon-supported platinum (Pt) based nanoparticles can be used as an oxygen reduction catalyst. These conventional carbon-supported Pt based nanoparticle catalysts (Pt/C) can provide high surface areas and moderate activities; however, Pt/C ORR catalysts have significant issues with durability which impede the development and application of PEMFCs.

Known Pt/C catalysts are prone to performance degradation during fuel cell operation due to at least agglomeration and growth of the Pt nanoparticle and/or stress of the carbon substrate, through the combined mechanisms of Pt crystallite migration, electrochemical Ostwald ripening, and carbon support corrosion. The degradation of the Pt/C catalyst subsequently reduces the power output of fuel cells and necessitates the use of higher quantities of noble metals such as Pt, gold, silver rhodium, palladium, ruthenium and osmium, further increasing the cost of PEMFCs.

Ways to improve the durability and the reaction activity of the ORR catalyst have been the focus of extensive research into alternative materials, co-catalysts, and support materials. While some success has been found in enhancing reaction activity or durability using these alternative materials, co-catalysts, and support materials, cost effective methods for achieving both enhanced activity and durability have proven elusive.

There remains a need for a Pt/C ORR catalyst having both an improved activity and improved durability suitable for use in PEMFCs, without increasing the cost or complexity of manufacturing and use.

SUMMARY

Embodiments of the present disclosure are directed to tungsten nitride (WN) enhanced Pt based ORR catalysts and related methods of manufacture and use.

According to embodiments of the disclosure, the WN enhanced Pt based ORR catalyst is one which improves retention of electrochemical surface area (ESCA), activity, and Pt nanoparticle size retention relative to conventional Pt based ORR catalysts, particularly carbon-supported Pt based nanoparticle catalysts (Pt/C), e.g. for use in fuel cells and/or other ORR reliant methods and devices. An advantage of a WN enhanced ORR catalyst according to the present disclosure is the superior activity and durability obtained using relatively inexpensive W for stabilizing and improving the efficacy of Pt in the catalyst, such that the requirement for expensive Pt or other noble metals in PEMFCs is reduced.

In at least one embodiment, a method of forming a WN enhanced ORR catalyst is provided. The method includes obtaining a Pt/C substrate, applying a WN film onto at least a portion of a surface of the Pt/C substrate, oxidizing the WN film by heating to an oxidizing temperature, and annealing the WN film at an elevated temperature to reduce at least a portion of the deposited WN film to metallic W. Nanoparticles may be preferred due to their corresponding high surface area which results in an increase in reaction activity, however the catalyst may take alternative forms depending on the particular processing employed. The oxidizing of the WN film may be performed in air at an oxidizing temperature of at least 150° C., at least 175° C., or more particularly at 200° C., for at least 1 h, or at least 2 h, more particularly for 3 h, in order to remove residual Pt—$H_2$ ligands from the Pt/C substrate without substantially altering the WN and Pt/C material further.

The annealing of the WN film may be performed in the presence of hydrogen gas ($H_2$), for example in the form of a mixture of $H_2$ and an inert gas, such as argon (Ar) gas. In one embodiment the mixture may include at least 20% $H_2$ by volume, with a balance of Ar at an elevated temperature of at least 600° C., or of at least 700° C., or preferably between 600° C. and 750° C., for at least 2.5 h, or more particularly at least 3 h. The annealing causes a significant decrease in the presence of nitrogen (N) across the surface of the catalyst, resulting in the formation of a tungsten metal/tungsten nitride (W/WN) blocking layer on the Pt/C substrate. The annealing step is performed in such a way that the W/WN blocking layer forms W-rich areas between Pt clusters in primarily separate phases, due to a coarsening and/or agglomeration of the Pt nanoparticles in the catalyst relative to W nanoparticles.

The application of the WN film onto at least the portion of the surface of the Pt/C substrate may be performed by one or more cycles, or surface reaction steps, of atomic layer deposition (ALD). The use of ALD for creating the WN film advantageously allows for atom-level control over the growth of the WN film on the Pt/C substrate, and the WN film may be formed or applied in an amorphous state prior to annealing. The application of the WN film and the remaining steps may be applied as a post-synthesis treatment, where the Pt/C substrate may be obtained by synthesizing Pt—$H_2$ ALD on a functionalized carbon black substrate.

The controlled application of the WN film by one or more cycles, or 2 or more, preferably 5 or more, or more preferably 10 cycles of ALD together with the annealing step enables novel synergistic interactions between the W/WN species in the blocking layer and the Pt of the WN enhanced Pt/C catalyst, without significant formation of alloy or intermetallic nanoparticles within the catalyst.

Conventional methods for synthesizing Pt—W nanoparticle catalysts include colloidal or galvanic replacement methods which ordinarily result in alloy and/or intermetallic particles and provide limited benefits relative to conventional Pt/C catalysts. By processing the catalyst according to the particular methods described in the current disclosure, it is possible to take advantage of an increased catalytic activity and stabilization resulting from the close proximity of a W/WN species and Pt nanoparticles in separate phases within the WN enhanced ORR catalyst. In an embodiment, additional catalytic enhancements may be obtained by using excess N present on the N-rich surface after ALD, or liberated from the WN film during the annealing step, as a dopant within the carbon support of the Pt/C substrate, regardless of the relationship between the W/WN blocking layer and the Pt nanoparticles. In this embodiment, the N migrates to the carbon support during application of the elevated temperature in the annealing step and is doped into the carbon support, leading to increased catalytic activity.

An embodiment of the current disclosure includes an WN enhanced ORR catalyst. The WN enhanced ORR catalyst includes a carbon substrate, Pt nanoparticles and a W/WN blocking layer overlying the carbon substrate. The carbon substrate may include carbon black, carbon nanotubes, carbon nanofibers, graphene and/or another functionalized carbon material, and may further be doped with N. The W/WN blocking layer may include metallic W and WN, with a W:N atomic ratio of 0.5 to 2, or at least 1, more particularly at least 1.5.

In an embodiment, the WN enhanced ORR catalyst may have an atomic composition including 0.5 to 1 at % W, 1.5 to 2 at % Pt, 0.25 to 0.75 at % N, and the balance C, such as 94 to 96 at % C. The WN enhanced ORR catalyst may have a mass activity of over 350 mA/mg, over 400 mA/mg or over 450 mA/mg, and retain at least 45% or at least 50% of mass activity after an accelerated durability test including 5,000 voltage cycles from 0.6 to 1.2 V at 100 mV s$^{-1}$, showing a substantial increase in ORR durability and performance relative to conventional catalysts.

The WN enhanced ORR catalysts of the disclosure may have an average particle size, or Feret diameter, of 6 to 8 nm, with an increase in size of no more than 1.5 nm (e.g., no more than 20%, or no more than 25%) following the accelerated durability test.

Embodiments of the disclosure include a fuel cell including a WN enhanced Pt/C ORR catalyst, such as in a PEMFC. Further embodiments include methods for creating a fuel cell by incorporating a WN enhanced Pt/C, and related methods of operation.

The above embodiments solve the problem of existing Pt/C catalysts by providing a more active and durable WN enhanced Pt/C ORR catalyst, for example for use in fuel cells. Features from any of the disclosed embodiments may be used in combination with one another, without limitation. For example, any of the compositional limitations described with respect to one embodiment may be present in any of the other described embodiments. In addition, other features and advantages of the present disclosure will become apparent to those of ordinary skill in the art through consideration of the following detailed description and the accompanying drawings.

The drawings and figures are not necessarily drawn to scale, unless otherwise indicated, but instead are drawn to provide a better understanding of the components, and are not intended to be limiting in scope, but to provide exemplary illustrations.

DETAILED DESCRIPTION OF VARIOUS EMBODIMENTS

To further clarify the above and other advantages and features of the present disclosure, a more particular description will be rendered by reference to specific embodiments thereof, which are illustrated in the appended drawings. It is appreciated that these drawings depict only typical embodiments of the disclosure and are therefore not to be considered limiting of its scope. The present disclosure will be described and explained with additional specificity and detail through the use of the accompanying drawings, in which like reference characters refer to like elements. It is to be understood that disclosure is not limited to the specific embodiments and methods described below, as specific components and/or conditions may, of course, vary. Furthermore, the terminology used herein is used only for the purpose of describing particular embodiments and is not intended to be limiting in any way.

Except in the examples, or where otherwise expressly indicated, all numerical quantities in this description indicating amounts of material or conditions of reaction and/or use are to be understood as modified by the word "about" in describing the broadest scope of the disclosure. Also, unless expressly stated to the contrary: description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation; and, unless expressly stated to the contrary, measurement of a property is determined by the same technique as previously or later referenced for the same property.

It must also be noted that, as used in the specification and the appended claims, the singular form "a," "an," and "the" may comprise plural references unless the context clearly indicates otherwise. For example, reference to a component in the singular is intended to comprise a plurality of components.

As discussed above, fuel cell and energy storage devices lack efficient and stable catalysts for oxygen reduction reactions (ORR), toluene hydrogenation reactions and other related reactions. Embodiments of the present disclosure provide a tungsten nitride (WN) enhanced, platinum (Pt) based ORR catalyst that offers a proven improvement in activity while increasing durability and long-term stability relative to conventional catalysts. The activity and durability properties of the disclosed ORR catalyst may be due to the preparation methods used, and embodiments of the disclosure include methods for forming the disclosed ORR catalyst, including related methods of use.

Figure 1:
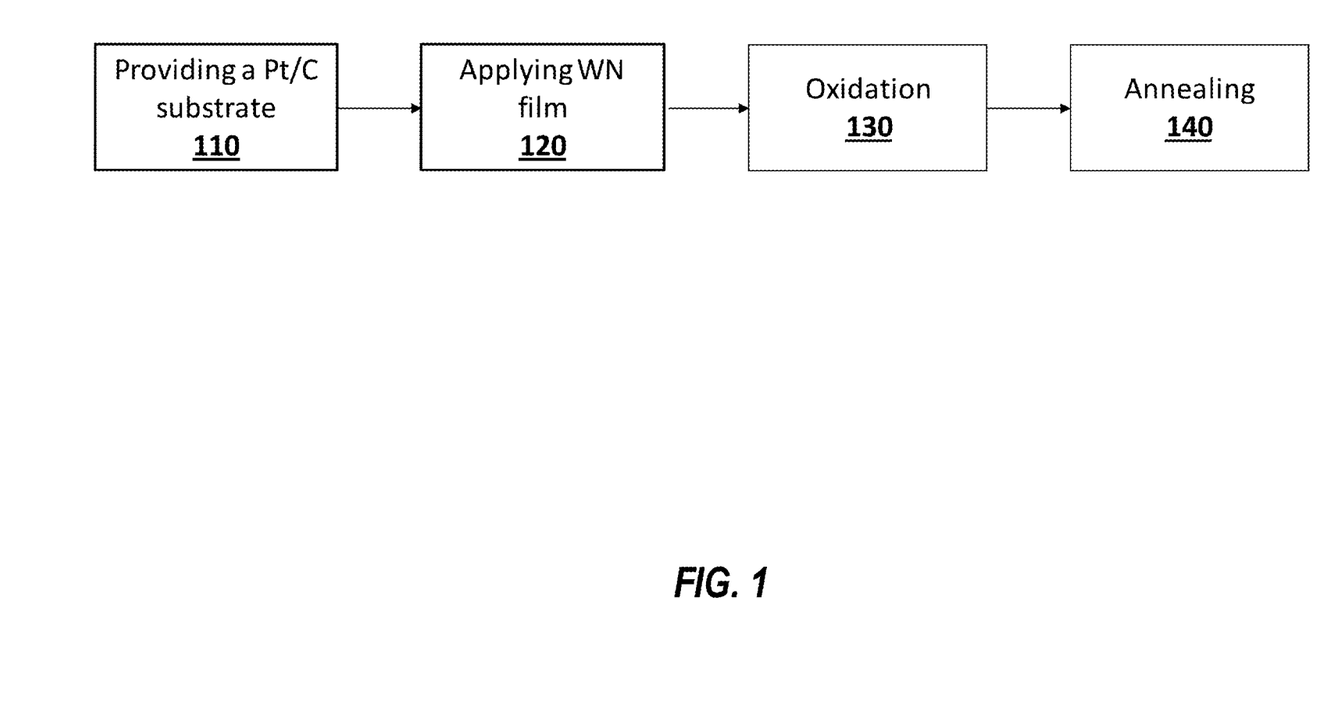
FIG. 1 shows a schematic flow chart of a method of forming a WN enhanced ORR catalyst according to an embodiment of the disclosure.

Referring now to FIG. 1, a method 100 of forming a WN enhanced ORR catalyst according to an embodiment of the disclosure is shown schematically in a flow chart. The method 100 may include providing a Pt/C substrate at step 110. The Pt/C substrate may be a conventional Pt/C catalyst or another Pt/C catalyst, and may comprise Pt nanoparticles on a carbon substrate, including carbon black, carbon nanotubes, carbon nanofibers and/or another functionalized or unmodified carbon material. Nanoparticles may be preferred due to their high surface area, however the catalyst may take alternative forms depending on the particular processing employed for realizing the method. In one example the Pt particles of the Pt/C substrate may have a particle size of 2 to 3 nm and may be distributed evenly across the carbon substrate.

According to one embodiment, the provided Pt/C substrate may be synthesized through Pt—$H_2$ atomic layer deposition (ALD) on a functionalized carbon black substrate (ALD Pt/f-C) in order to form a Pt nanoparticles on the carbon substrate. An ALD Pt/f-C catalyst may be advantageous in methods of the current disclosure, due to the high amount of oxygen-containing groups available on the functionalized carbon which may facilitate enhanced ALD growth rates over an unmodified carbon substrate.

The method 100 may include the step 120 of applying a tungsten nitride (WN) film onto at least a portion of a surface of the Pt/C substrate. The application of the WN film onto at least the portion of the surface of the Pt/C substrate may be performed by one or more cycles, or surface reaction steps, of ALD. Advantageously, oxygen terminated sites on a functionalized carbon substrate of ALD Pt/f-C can provide sites for nucleation and growth of the WN species, and may facilitate application of the WN film.

In one embodiment, WN ALD structures may be added to the Pt/C substrate using WN and ammonia ($NH_3$) as alternating reagents in a fluidized bed reactor, with a WN dose held for 10 to 15 min while a $NH_3$ dose is held for 15 to 25 min in a single ALD cycle. The gases may be purged between half-cycles, such as with nitrogen gas ($N_2$) or an inert gas. The reactor and reactant bubbler may be held between 275° C. and 325° C., more particularly 300° C. (for the reactor), and between 30° C. and 50° C., more particularly 40° C. (for the bubbler).

The use of ALD for creating the WN film advantageously allows for atom-level control over the growth on the Pt/C substrate, and the WN film may be formed homogenously on the Pt/C substrate in an amorphous state such that Pt, W and N are present evenly across the surface of the Pt/C substrate with the WN film. The controlled application of the WN film by one or more cycles, or two or more, preferably 5 or more, or more preferably 10 cycles of ALD, but preferably not exceeding 15 cycles, allows for precise control of the thickness of the WN film and resulting W/WN nanoparticles. The thickness of the WN film may further be coordinated with the size of the Pt nanoparticles in the Pt/C catalyst and/or with the parameters of a subsequent oxidation step 130 and an annealing step 140, such as time and temperature.

In one example, the application of the WN film onto the Pt/C substrate may be adapted to add at least 1 wt % W to the catalyst, at least 2 wt % W, or between 5 to 8 wt % W, more particularly 6 to 7 wt % W. The Pt/C substrate with the WN film may also include 14 to 18 wt % Pt, more particularly 15 to 17 wt % Pt. The balance of the material may be carbon.

The selection of an appropriate thickness of the WN film can be critical to realizing the advantages of some embodiments, as the size and location of the resulting W/WN particles relative to the Pt nanoparticles enable novel synergistic interactions between the W/WN species and the Pt of the catalyst, without any significant formation of alloy or intermetallic nanoparticles between W and Pt. Likewise, application of a WN film that is too thick may cover the Pt nanoparticles entirely and severely decrease the efficacy of the catalyst.

The requirements and advantages of the disclosed methods appear to be reliant on the use of W according to the particular methods of the current disclosure. Prior art efforts for enhancing a Pt/C catalyst with W include colloidal or galvanic replacement methods which ordinarily result in alloy and/or intermetallic particles and provide limited benefits relative to conventional Pt/C catalysts. ALD applied methods for enhancing the activity of Pt/C catalysts generally require specialized carbon materials and rely on metal dioxides, which fail to achieve the synergistic effects and improvements of the current disclosure.

The oxidation step 130 may include subjecting the Pt/C substrate with the WN film to oxidation at a low temperature. In an example, an oxidation temperature of at least 150° C., at least 175° C., or more particularly at 200° C. is applied to the Pt/C substrate with the WN film, for a period at least 1 h, or at least 2 h, more particularly for 3 h. The oxidation may take place in air or ambient atmosphere.

The oxidation step 130 contributes to the removal of residual Pt—$H_2$ ligands, the existence of which may decrease a limiting current of the final catalyst. However, the oxidation should not substantively affect the material in other ways.

The annealing step 140 may include a thermal treatment of the oxidized Pt/C catalyst with the WN film at an elevated temperature in a controlled atmosphere to reduce the deposited WN film at least in part to metallic W and form the resulting WN enhanced Pt/C catalyst. The elevated temperature employed for the anneal may be at least 600° C., or at least 700° C., or preferably between 600° C. and 750° C. (e.g., at 725° C.), for a time period of at least 2.5 h, more particularly at least 3 h. The controlled atmosphere may include a mixture of hydrogen gas ($H_2$) and an inert gas, for example argon gas (Ar). The mixture may include (e.g., by volume) at least 10%, at least 15%, at least 20% or more particularly 20% $H_2$, with a balance of the inert gas.

The thermal treatment of the annealing step 140 induces a number of structural changes in the Pt/C substrate with the WN film which contribute to the improved activity and durability of the WN enhanced Pt/C catalyst.

As noted previously, the anneal serves to reduce the deposited WN film at least in part to metallic W, such that a significant decrease in N across the surface of the catalyst results and a W/WN blocking layer is formed on the Pt/C substrate. In some embodiments, the W/WN blocking layer may include metallic W and WN, with a W:N atomic ratio of 0.5 to 2, or at least 1, more particularly at least 1.5. A corresponding W:N atomic ratio of the Pt/C substrate with the WN film prior to the annealing step 140 may be 0.2 to 0.5, or less than 0.5.

The anneal of the Pt/C substrate with the WN film may result in a change in atomic composition of the material, as shown in the energy dispersive X-ray spectroscopy (EDS) quantification shown in Table 1, with a marked decrease in N and a marked increase in W.

TABLE 1

| EDS Quantification | | | | |
|---|---|---|---|---|
| | W at % | Pt at % | N at % | C at % |
| Pt/C substrate with WN film | 0.1-0.4 | 1.5-2 | 0.8-1 | 94-96 |
| Annealed WN enhanced Pt/C catalyst | 0.5-1 | 1.5-2 | 0.25-0.75 | 94-96 |

Surprisingly, the thermal treatment causes a coarsening of the Pt nanoparticles and a slight agglomeration of W, but not to the extent of the coarsening of Pt. The W remains dispersed across the surface of the catalyst in the W/WN blocking layer, although its presence may be reduced at the edges of carbon particles, forming W-rich areas between and surrounding Pt clusters in primarily separate phases due to the coarsening and/or agglomeration of the Pt nanoparticles in the catalyst relative to W.

In some embodiments, the thermal treatment may result in an average particle size, or Feret diameter, of 6 to 8 nm, in the catalyst, with an increase in size of no more than 1.5 nm (e.g., no more than 25%, or no more than 20%) following an accelerated durability test as described in the examples below.

Retaining Pt and W in primarily separate phases, and the reduced correlation in the positions of Pt and W after thermal treatment, enhances the catalytic activity of the resulting WN enhanced Pt/C catalyst. Whereas conventional methods for synthesizing Pt—W nanoparticle catalysts result in alloy and/or intermetallic particles that provide limited benefits relative to conventional Pt/C catalysts, the dispersion, position, size and close proximity of the W/WN species in embodiments of the current disclosure relative to the Pt nanoparticles directly contributes to superior ORR performance. This contribution may be the modification of adsorption strength of oxygen-based ORR intermediates via synergistic interactions between the W/WN species and Pt, such as weakening the binding strength of oxygenated species, and/or may be an induction of a d-band shift in Pt through strong electronic ligand effects.

The annealing of the WN film and resulting structural effects similarly contribute to an increased durability of the WN enhanced catalyst. In one aspect, the dispersion, position, size and close proximity of the W/WN species in embodiments of the current disclosure relative to the Pt nanoparticles may stabilize the Pt nanoparticles on the carbon substrate, such as when exposed to the degradation effects inherent to fuel cells.

The WN enhanced catalyst may have a mass activity of over 350 mA/mg, over 400 mA/mg or over 450 mA/mg, and retain at least 45% or at least 50% of mass activity after an accelerated durability test including 5,000 voltage cycles from 0.6 to 1.2 V at 100 mV s$^{-1}$, showing a substantial increase in ORR performance relative to conventional catalysts and alternative methods of enhancement.

It is noted that the described advantages may be reliant on the use of W according to the particular methods of the current disclosure, and the thermal treatment of the Pt/C substrate with the WN film may be important to realizing any durability benefits. By processing the catalyst according to the particular methods described in the current disclosure, it is possible to take advantage of an increased catalytic activity and stabilization resulting from the close proximity of a W/WN species and Pt nanoparticles in separate phases within the ORR catalyst. Prior to the annealing step 140, the deposited WN film is not stable in an acidic environment and also does not provide the enhanced catalytic activity described for the WN enhanced catalyst. Similarly, the presence of the W/WN blocking layer may be important for providing the majority of the increase in half-wave potential of the WN enhanced catalyst.

Figure 2:
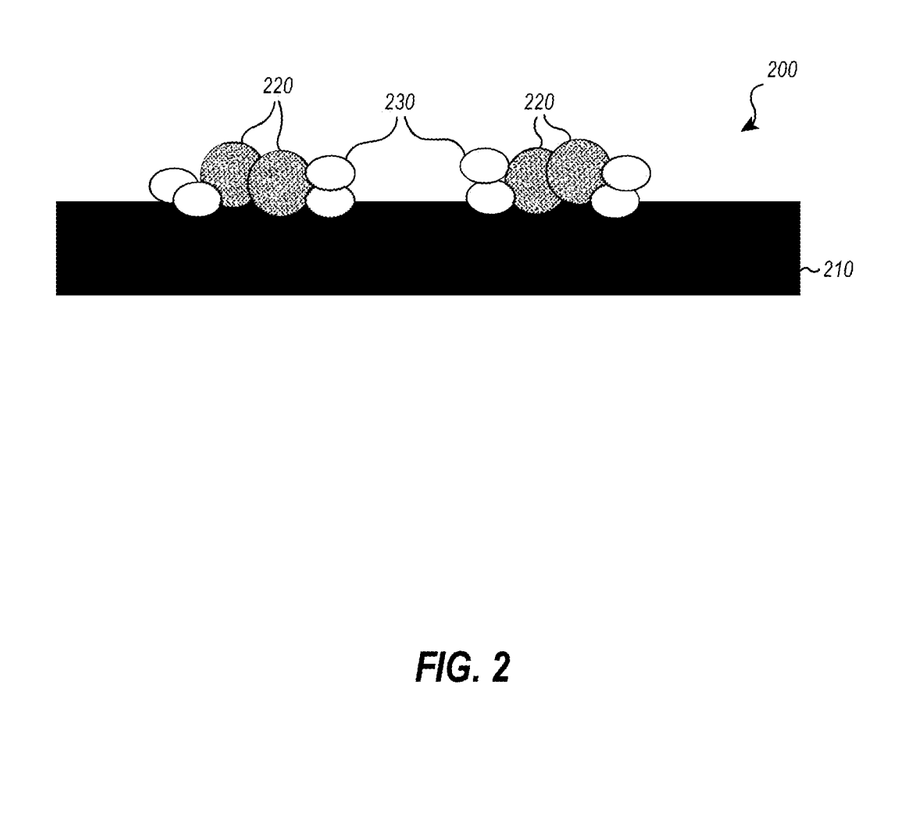
FIG. 2 is a schematic side view of a WN enhanced ORR catalyst according to an embodiment of the disclosure.

As shown in FIG. 2, an embodiment of the current disclosure includes an ORR catalyst, such as formed by methods of the current disclosure. The catalyst 200 includes a carbon substrate 210, Pt nanoparticles 220 and a W/WN blocking layer 230 overlying the Pt nanoparticles 220, as illustrated in FIG. 2. The carbon substrate 200 may include carbon black, carbon nanotubes, carbon nanofibers and/or another functionalized carbon material, and may further be doped with N (not illustrated). The W/WN blocking layer 230 may include metallic W and WN, with a W:N atomic ratio of 0.5 to 2, or at least 1, more particularly at least 1.5.

The W/WN blocking layer 230 may be present on the surface of the Pt nanoparticles 220, and form a continuous and electrically interconnected layer with pores defined therein, exposing coarse Pt nanoparticles therein. The position of the W/WN blocking layer 230 protects the Pt nanoparticles 220 from degradation which ordinarily occurs while in use in a fuel cell, due to the corrosion resistance of the W/WN blocking layer 230 under acidic and oxidizing conditions, as well as by steric stabilization of the nanoparticles.

In one embodiment, the WN enhanced Pt/C catalyst may have an atomic composition according to the EDS quantification shown in Table 1. The catalyst may have a mass activity of over 350 mA/mg, over 400 mA/mg or over 450 mA/mg, and retain at least 45% or at least 50% of mass activity after an accelerated durability test including 5,000 voltage cycles from 0.6 to 1.2 V at 100 mV s$^{-1}$, showing a substantial increase in ORR performance relative to conventional catalysts.

The described mass activity and durability of the WN enhanced Pt/C catalyst is significantly higher than a commercial Pt/C catalyst, an ALD Pt/f-C catalyst, and the Pt/C catalyst with the WN film prior to annealing.

Figure 9:
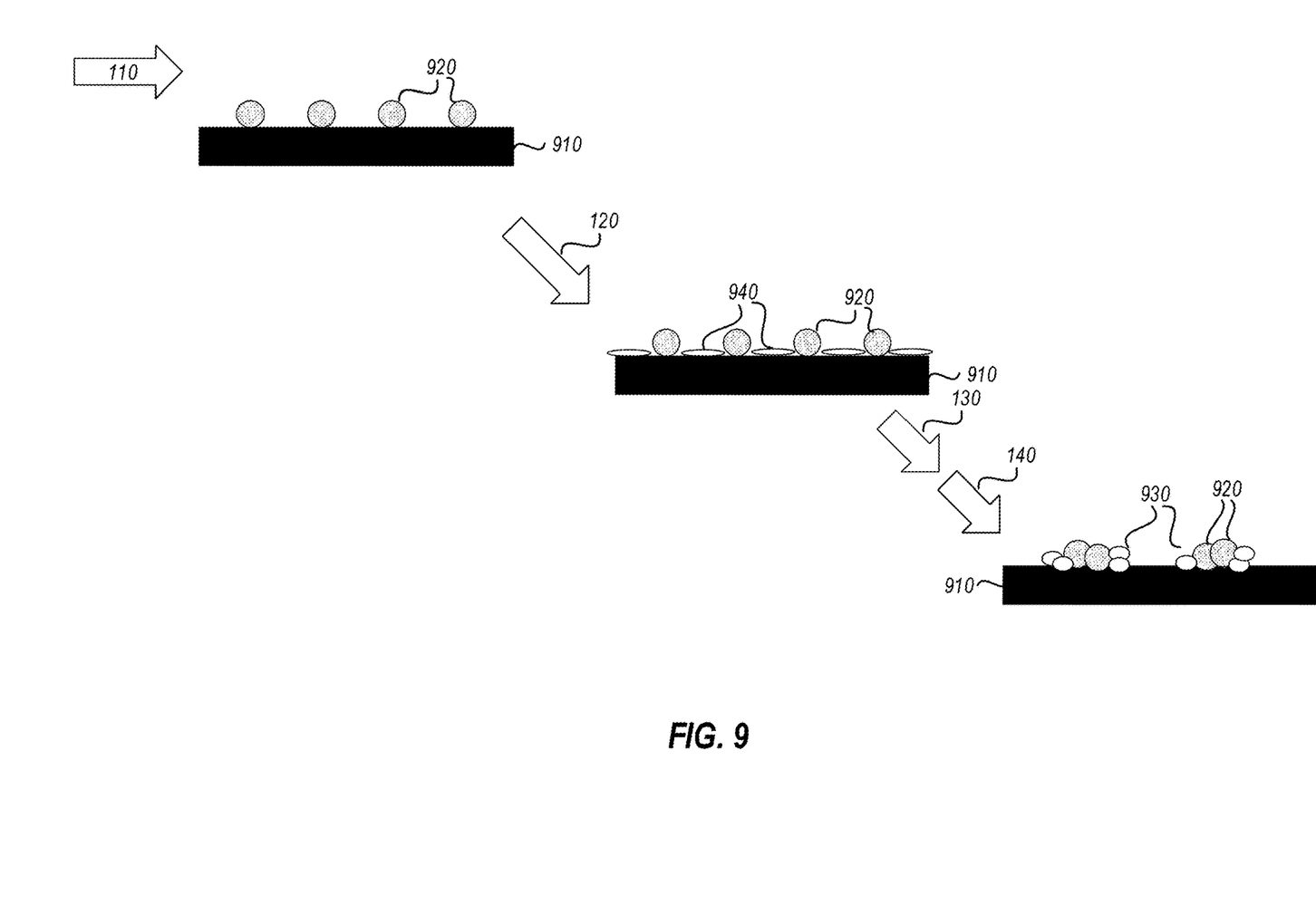
FIG. 9 is a schematic side view of the formation of a WN enhanced ORR catalyst according to an embodiment of the disclosure.

As shown in FIG. 9, a method according to an embodiment of the current disclosure may form several intermediates prior to achieving a WN enhanced ORR catalyst 900. As previously indicated, the step of providing a Pt/C catalyst may include the formation of Pt nanoparticles 920 on the surface of a carbon substrate or support 910, for example evenly and homogeneously dispersed thereon. Following application of a WN film using ALD 120, the carbon support 910 is coated with a WN film 940 which may be evenly and homogeneously dispersed thereon.

As discussed previously, the oxidation step 130 is adapted to remove residual Pt—H$_2$ ligands, the existence of which may decrease a limiting current of the final catalyst. However, the oxidation should not substantively affect the material in other ways.

Coarsening and agglomeration of the Pt nanoparticles 920 during the annealing step 140 moves the Pt nanoparticles 920 closer together on the surface of the carbon substrate 910, as illustrated in FIG. 9. The WN film is likewise reduced to a W/WN blocking layer 930 including metallic W and a reduced amount of N, but experiences less coarsening and agglomeration than the Pt nanoparticles 920. The W remains dispersed across the surface of the catalyst in the W/WN blocking layer 930, forming W-rich areas between and surrounding Pt nanoparticle 920 clusters in primarily separate phases.

The following examples are provided to illustrate an embodiment of the current disclosure and to more particularly demonstrate the advantages of the embodiments but are not intended to limit the scope thereof.

Examples 1~4 below are based on the modification of a catalyst synthesized through Pt—H$_2$ ALD on a functionalized carbon black substrate (ALD Pt/f-C) with WN nanostructures according to an embodiment of the disclosure. Ten cycles of WN ALD were applied to the Pt/f-C catalyst. WN ALD structures were added to the ALD Pt/f-C catalyst using bis(tert-butylimido)bis(dimethylamido)tungsten (($^t$BuN)$_2$(Me$_2$N)$_2$W) and NH$_3$ as alternating reagents in a fluidized bed reactor. In a single ALD cycle, the ($^t$BuN)$_2$(Me$_2$N)$_2$W dose was held for 13 minutes, and the NH$_3$ was held for 20 minutes. Gases were purged between half-cycles with N$_2$. The reactor and reactant bubbler were held at 300° C. and 40° C., respectively. Ten ALD cycles are deposited to produce catalyst 10WN. The 10WN catalyst was subjected to a 200° C. oxidation in air for 3 h to remove residual Pt—H$_2$ ALD ligands, followed by a 725° C. anneal in 20% H$_2$ with balance Ar for 3 h to produce material 725° C.-10WN for further analysis.

Example 1

Figure 3:
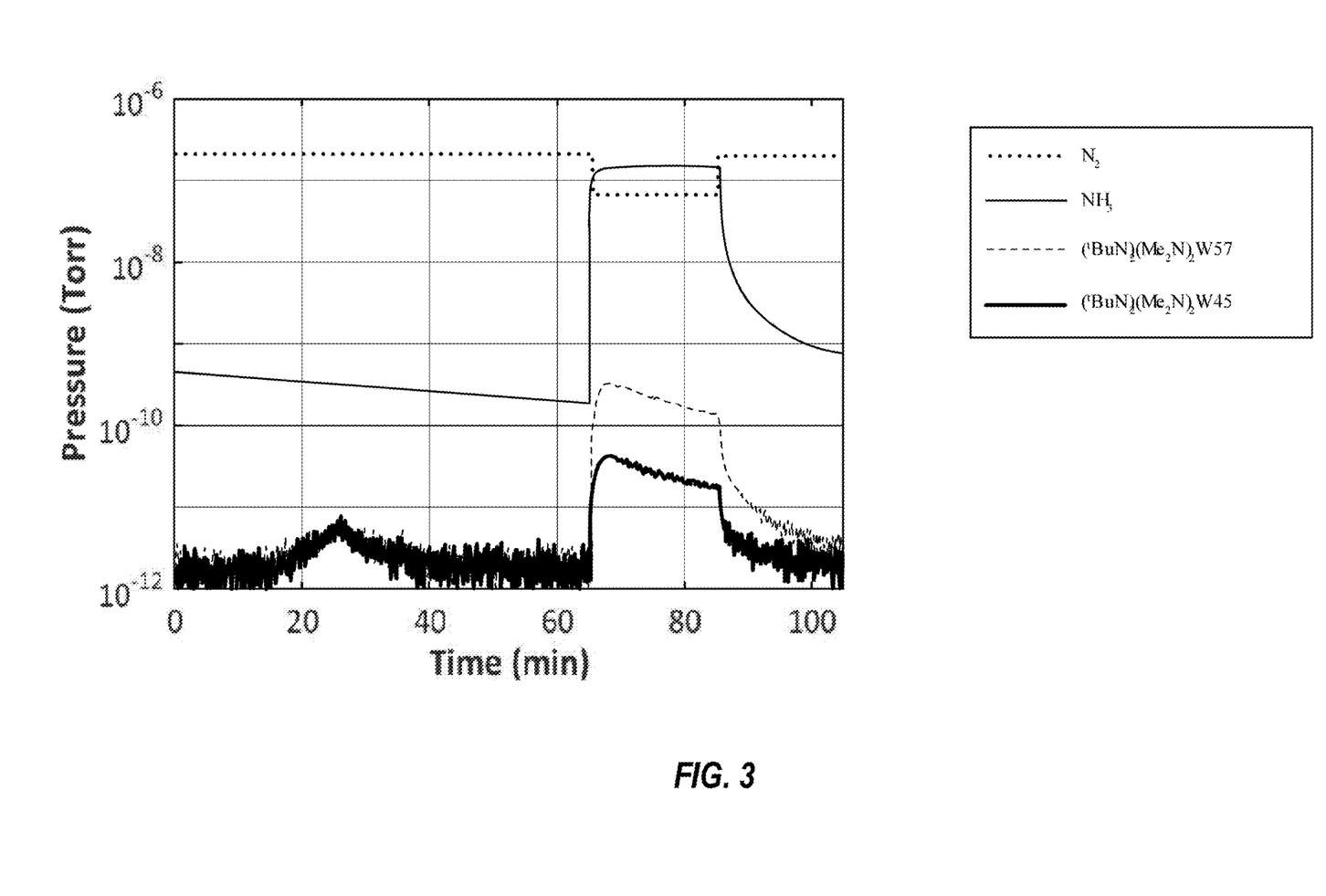
FIG. 3 is the results of Time-resolved mass spectrometry traces of m/z=28 ($N_2$), 17 ($NH_3$), 45, and 57 (($^tBuN)_2$ ($Me_2N)_2W$ fragments) during a WN ALD cycle according to an embodiment of the disclosure.

During the modification of the catalyst described above, an in-line mass spectrometer was used to monitor gases exiting the reactor. A representative mass spectrometry trace during a single WN ALD cycle is shown in FIG. 3. The emergence of signals corresponding to the ($^t$BuN)$_2$(Me$_2$N)$_2$W fragments shown at ~25 minutes was indicative of saturation of the available surface sites; therefore, the metal precursor dose ended with the appearance of these fragments. The NH$_3$ dose shown at ~65 minutes was marked by a rapid rise in the same fragments due to ligand composition, and the dose was held for 20 minutes.

Example 2

ALD Pt/f-C and 10WN were analyzed for Pt and W content using inductively coupled plasma mass spectroscopy (ICP-MS) after digestion in an aqua regia/HF mixture. Elemental analysis with ICP-MS of the original and post-ALD catalysts (Table 2) showed the addition of 6.33 wt % W after 10 ALD cycles.

TABLE 2

| ICP-MS | | |
|---|---|---|
| | Pt wt % | W wt % |
| ALD Pt/f-C | 19.8 | — |
| 10WN | 16.0 | 6.33 |

Example 3

Dark field and bright field microscopy and EDS mapping were performed on as-synthesized catalysts by depositing catalyst powder on carbon film 200 mesh copper grids using a transmission electron microscope (TEM) operated at 200 kV in scanning mode.

Figure 4:
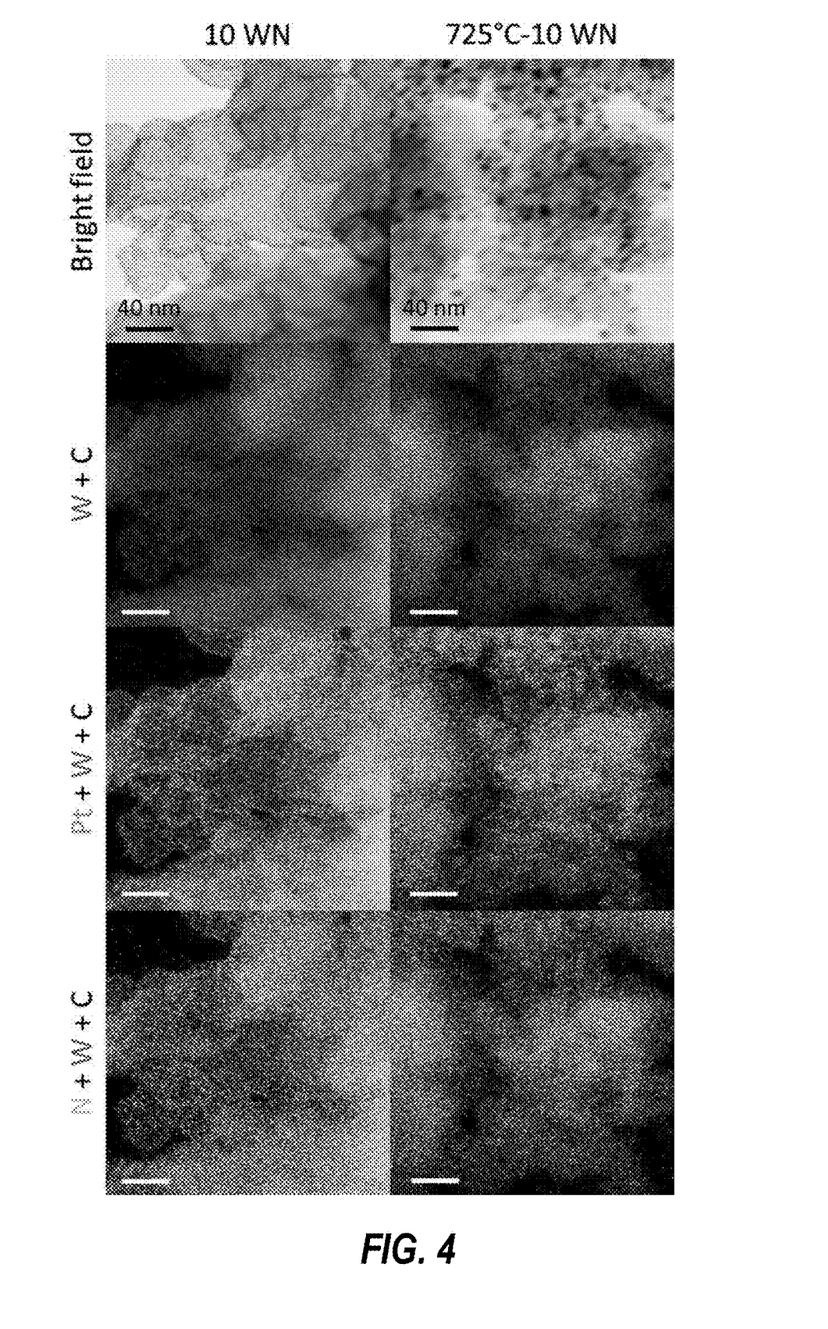
FIG. 4 illustrates bright field STEM images and corresponding EDS overlays of elemental maps showing the distribution of Pt, C, W, and N in 10WN and 725° C.-10WN samples.

STEM images and corresponding EDS maps for 10WN and 725° C.-10WN are shown in FIG. 4. EDS quantification values are listed in Table 3. Analysis of the 10WN EDS maps showed the homogeneous presence of Pt, W, and N across the surface. The ALD Pt/f-C surface was initially covered in dispersed 2-3 nm Pt nanoparticles; the significant overlap between W and Pt in 10WN shows that, during the ALD process, WN was deposited evenly throughout the Pt nanoparticles. The further overlap between N and W confirms the presence of a nitride species.

TABLE 3

| EDS Quantification | | | | |
|---|---|---|---|---|
| | W at % | Pt at % | N at % | C at % |
| 10WN | 0.25 | 1.83 | 0.84 | 95.01 |
| 725° C.-10WN | 0.73 | 1.68 | 0.39 | 95.83 |

Coarsening of the Pt nanoparticles following thermal treatment was apparent in the bright field images of 725° C.-10WN and corresponding Pt maps. W was also slightly agglomerated during thermal treatment, but not to the same extent as Pt. The W map of 725° C.-10WN still shows dispersed W across the surface, though its presence is reduced at the edges of the carbon particles.

The combined overlay of Pt and W showed distinct W-rich areas present between the Pt clusters and less correlation between the positions of Pt and W after thermal treatment than before. These results indicated that the Pt and W species remain in mostly separate phases in the 725° C.-10WN catalyst and the thermal treatment likely did not produce alloy or intermetallic nanoparticles, as has often been observed with other Pt—W nanoparticle catalysts synthesized by colloidal or galvanic replacement methods.

A significant decrease in the presence of N across the surface was observed from 10 WN to 725° C.-10WN in the N+W maps in FIG. 4; this was also reflected by the decrease in N at % in Table 3 between the two catalysts. The W:N atomic ratio of 10WN increased from 0.3 to almost 1.9 after thermal treatment, which indicated that the partial hydrogen atmosphere of the thermal treatment significantly changes the stoichiometry of the WN nanostructures. This process created a catalyst surface in 725° C.-10WN with more metallic character but did not completely eliminate the presence of N.

Example 4

Figure 5:
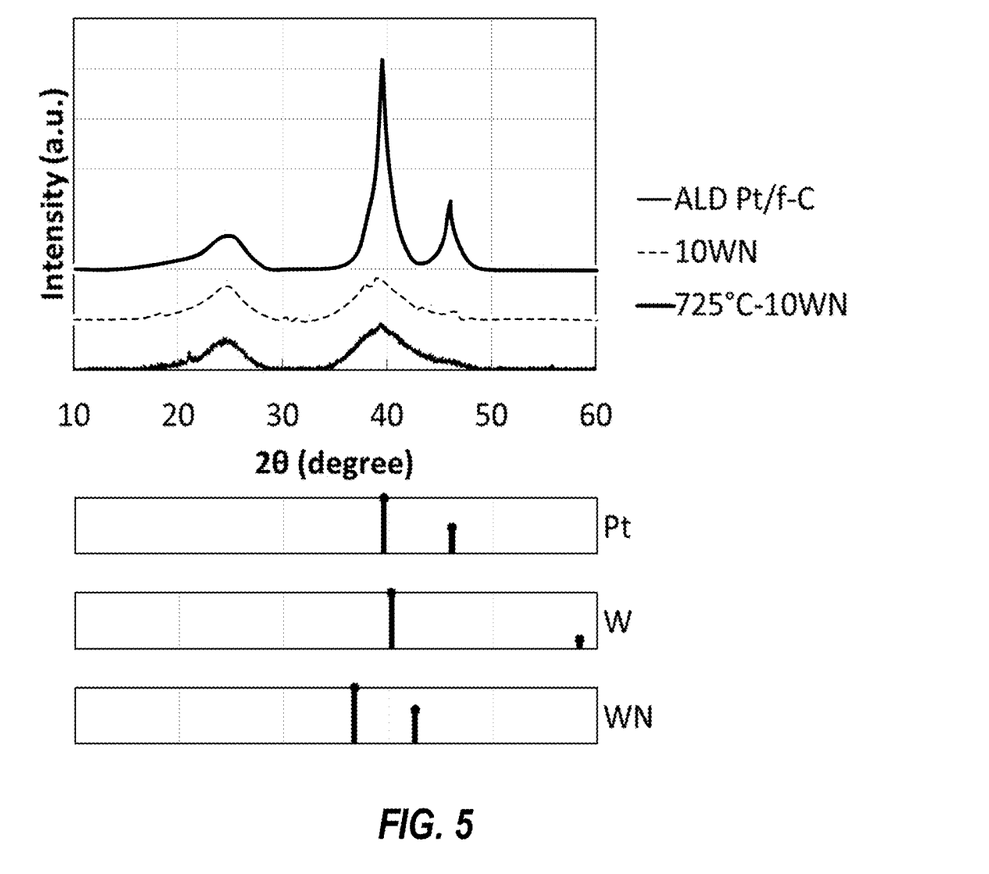
FIG. 5 shows the results of XRD analysis of catalysts used according to methods of an embodiment of the disclosure, with normalized XRD patterns for Pt, W and WN.

All catalysts were probed with X-ray diffraction (XRD) with a Cu source operating at 300 W, and the results are shown in FIG. 5, alongside normalized XRD patterns for Pt, W, and WN. The XRD pattern for ALD Pt/f-C catalyst showed broad Pt peaks around 39° and 46°, with a broad amorphous carbon peak near 25°. The addition of 10 WN ALD cycles did not result in any discernable changes in the 10WN pattern. The presence of WN in this catalyst was previously confirmed through ICP-MS and STEM-EDS, and the quantity of WN on the surface may not have been large enough to produce a distinct reflection during the XRD analysis, and the WN present in the 10WN catalyst was likely not crystalline and would not be expected to produce large XRD peaks.

Application of thermal treatment greatly increased the sharpness and intensity of the Pt peaks in the 725° C.-10WN pattern. This was attributed to the Pt coarsening observed in the bright field images in FIG. 4. Also noteworthy was the relatively unchanged position of the Pt peak at 39° after thermal treatment, indicating that the Pt lattice was not detectably compressed by the surrounding W on the surface, supporting that Pt and W remain primarily in separate phases. The 725° C.-10WN pattern does not show any distinct reflections for W, despite an increased presence of metallic W (as seen in FIG. 4) and a high likelihood that any W/WN species would exist in a crystalline phase by 725° C. This may be due to insufficient quantities of W for detection through this technique, or the presence of the primary W peak at 40° may be obscured by the larger Pt reflection at 39°.

Example 5

Electrochemical performance of the catalysts was assessed through RDE voltammetry. Ink dispersions were made from the catalyst powders using ultrapure water, isopropyl alcohol (Sigma-Aldrich), and 5% Nafion ionomer (Sigma-Aldrich). After a 1 hour sonication, a 10 µL aliquot of ink was drop-coated onto a glassy carbon electrode and rotated at 700 rpm in an inverted position on a RDE test stand.

After drying, the working electrode was submerged in an aqueous electrochemical cell (0.1 M $HClO_4$) with a Pt coil counter electrode and regular hydrogen electrode (RHE) reference. After a 100 cycle break-in (0.025 to 1.2 V at 500 mV $s^{-1}$), cyclic voltammograms (CVs) were taken from 0.025 to 1.0 V at 10 mV $s^{-1}$ in an $N_2$-purged cell with no rotation. The calculated hydrogen under potential deposition ($H_{UPD}$) charge from 0.06 to 0.4 V was used to calculate the electrochemical surface area (ECSA). Polarization curves were taken from 1.0 to –0.01 V at 20 mV $s^{-1}$ in an $O_2$-purged cell at 1600 rpm and the anodic scan was used for analysis. Background curves were taken with the same parameters under $N_2$ and used to correct the polarization curves. Kinetic current ($I_k$) was determined according to equation 1, using the current at 0.9 V (I) and the mass-transfer limited current ($I_{lim}$), taken at 0.4 V.

$$I_k = \frac{I_{lim} \times I}{I_{lim} - I} \quad \text{Equation 1}$$

Mass activities ($i_{m0.9v}$) were then calculated by normalizing $I_k$ by the mass loading of Pt on the electrode. ECSA and mass activity were calculated initially and after an accelerated durability test (ADT) of 5,000 voltage cycles from 0.6 to 1.2 V at 100 mV $s^{-1}$. Initial cyclic voltammograms (CVs) and polarization curves for ALD Pt/f-C, 10WN, and 725° C.-10WN are shown in FIGS. 6A-6B.

Figure 6A:
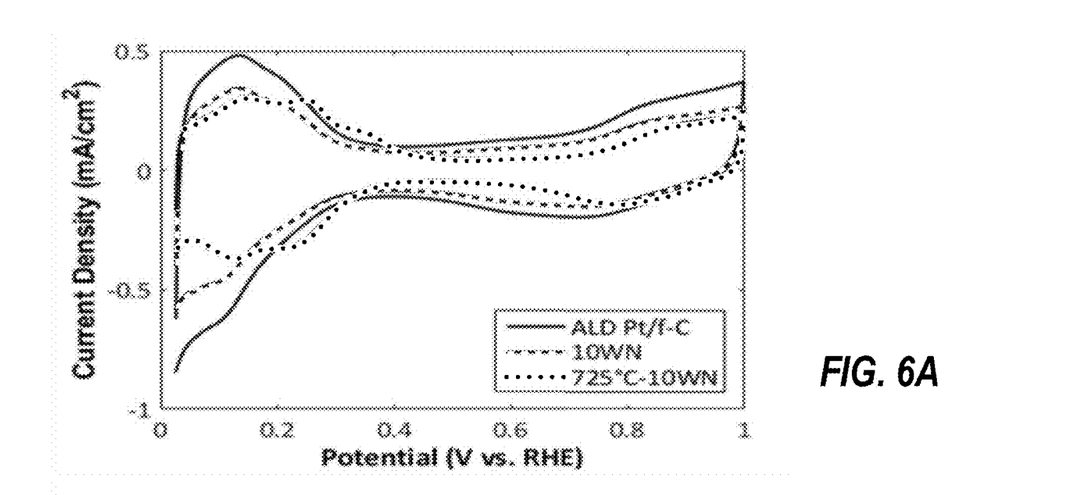
FIG. 6A shows the results of electrochemical performance analysis of catalysts used according to methods of an embodiment of the disclosure, showing initial cyclic voltammograms.

An apparent decrease in the magnitude of the Pt $H_{UPD}$ peak was observed for 10WN and 725° C.-10WN as shown in FIG. 6A. This decrease was likely due to Pt nanoparticle coarsening during ALD and thermal treatment; however, ECSA values for these catalysts were actually greater than ALD Pt/f-C after accounting for changes in Pt content with the addition of ALD (see FIG. 7A).

The CV for 725° C.-10WN exhibited a sharply-defined peak in the more positive potential region of the $H_{UPD}$ (0.2-0.3 V) that was not prominent in the other catalysts. This peak was associated with strongly adsorbed hydrogen species on the Pt(100) surface, and its emergence in the CV indicated that thermal treatment and the resultant Pt nanoparticle coarsening exposed more of this particular facet than was present in the initial catalysts. The CV for 725° C.-10WN also showed a positive shift in the oxygen adsorption/desorption peaks relative to the other catalysts, indicating that oxygenated species did not bind as tightly to the 725° C.-10WN catalyst sites. The 725° C.-10WN catalyst also exhibited the lowest double layer capacitance contribution in its CV, likely due to the elimination of any residual O-containing surface groups on the functionalized carbon substrate during thermal treatment.

Figure 6B:
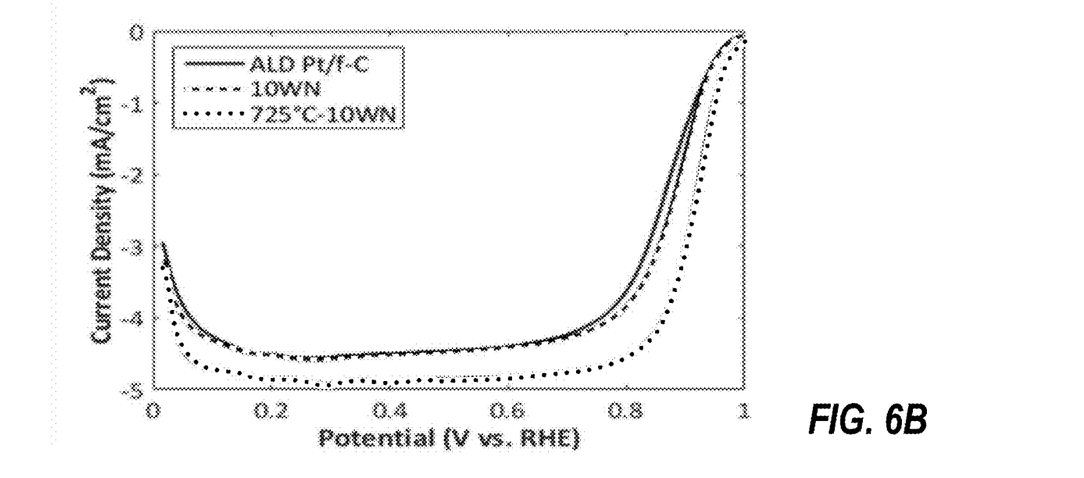
FIG. 6B shows the results of electrochemical performance analysis of catalysts used according to methods of an embodiment of the disclosure, showing polarization curves.

The initial polarization curves in FIG. 6B showed relatively similar ORR performance for ALD Pt/f-C and 10WN, though 10WN was slightly more active due to a more positive half-wave potential. Thermal treatment resulted in a significantly more positive half-wave potential as well as an increased limiting current for the 725° C.-10WN catalyst. A portion of this catalytic enhancement (primarily, the increase in limiting current) can be attributed to the removal of residual Pt—$H_2$ ALD ligands during the first phase of thermal treatment (200° C. oxidation in air). The majority of the increase in half-wave potential occurred after treatment of the catalyst at 725° C. under 20% $H_2$. Additional control experiments in which the ALD Pt/f-C was exposed to similar conditions of 700° C. under 20% $H_2$ showed that thermal treatment alone was not responsible for the full half-wave potential increase; the presence of ALD-deposited W species in 725° C.-10WN was an important contributor to its superior ORR performance. This indicated that the catalytic activity was distinctly enhanced by the creation of W-rich nanostructures in close proximity to the larger Pt nanoparticles of 725° C.-10WN, as was observed in FIG. 4. The CV results support the assertion that binding strength of oxygenated species was weakened in 725° C.-10WN, and a d-band shift may have been induced in Pt through strong electronic ligand effects. Excess nitrogen atoms (either present on the N-rich surface after ALD or liberated from the WN) may have been doped into the carbon support during the 725° C. treatment, thereby leading to improved catalytic activity regardless of the relationship between the W and Pt species.

Figure 7A:
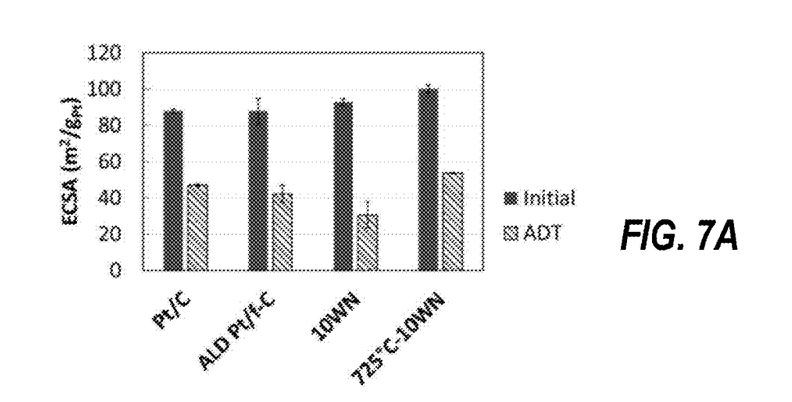
FIG. 7A shows the results of electrochemical performance analysis of catalysts used according to methods of an embodiment of the disclosure, showing electrochemical surface areas initially and after a 5,000 voltage cycle durability test.
Figure 7B:
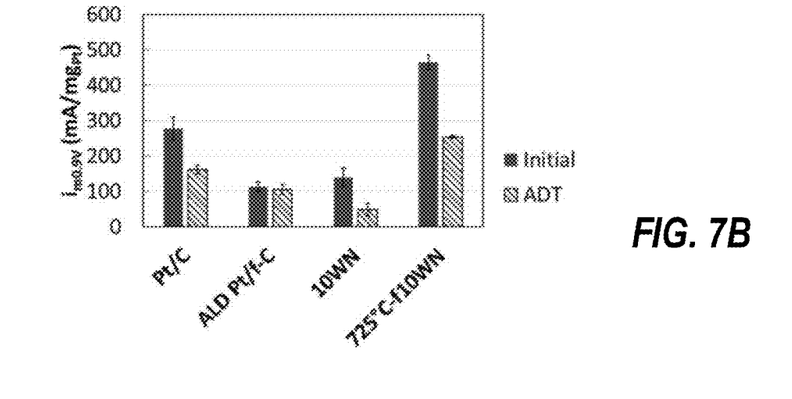
FIG. 7B shows the results of electrochemical performance analysis of catalysts used according to methods of an embodiment of the disclosure, showing mass activities initially and after a 5,000 voltage cycle durability test.

The electrochemical durability of the catalysts was assessed using an accelerated durability test; results of the analysis for ECSA and mass activity are presented in FIGS. 7A-7B. The performance of the ALD catalysts was benchmarked against a commercial Pt/C. All catalysts were observed to lose ECSA over voltage cycling, with 725° C.-10WN proving the most robust. Similarly, 725° C.-10WN had the best performance in mass activity over the durability test, starting with the highest value reported in the current study for any catalyst, 465 mA/mg, and retaining 55% of that mass activity over voltage cycling. The initial mass activity of 725° C.-10WN was considerably higher than that of commercial Pt/C, and its ADT value was on par with the initial activity of Pt/C. The enhanced durability of this catalyst was likely due to the stabilization of the Pt nanoparticles by nearby W/WN species on the carbon substrate.

At first glance, the ALD Pt/f-C appeared to have superior retention of mass activity as a percentage of its initial value; however, this did not comport with the catalyst's observed ECSA loss. The apparent mass activity retention of ALD Pt/f-C was established to be an artifact of the residual Pt—$H_2$ ALD ligands on its surface and was the result of simultaneous oxidation of the ligands (activity increase) and Pt nanoparticle sintering (ECSA/activity decrease) during voltage cycling.

Surprisingly, the 10WN catalyst appeared to have the worst durability in regards to ECSA and mass activity, despite the addition of 10 cycles of WN ALD. This indicated that the as-deposited WN was not stable in the acidic environment under voltage cycling (perhaps due to its as-deposited amorphous state), and thermal treatment is necessary to realize any durability benefits from the deposited materials.

Example 6

Bright field microscopy images of catalysts before and after electrochemical durability testing were acquired by depositing catalyst powder on carbon film 200 mesh copper grids and examining under a TEM. Particle size distributions were tabulated from these images using ImageJ (an open source image processing program from the Nation Institutes of Health), in which Feret diameters were calculated from a total of 200 Pt nanoparticles taken from 3 separate areas of the catalyst. Feret diameters initially and after durability testing were compared using a t-test assuming unequal variance. Representative TEM images initially and after durability testing are shown in FIG. 8, along with particle size distributions for each catalyst.

Figure 8:
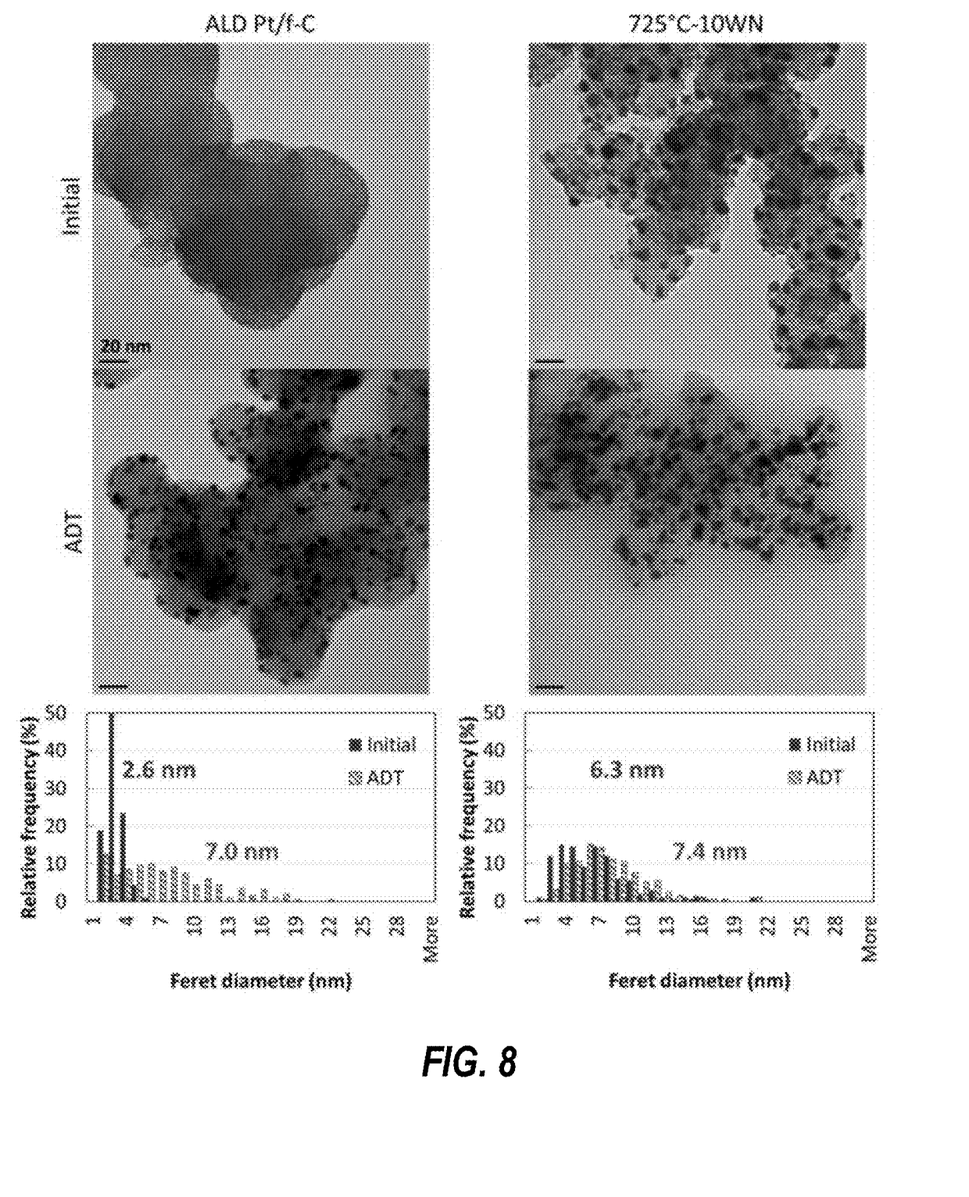
FIG. 8 illustrates side-by-side TEM images for ALD Pt/f-C and 725° C.-10WN catalysts initially and after durability testing. Particle size distributions tabulated from multiple images are reported herein along with mean initial and ADT nanoparticle diameters.

A significant shift, from a narrow initial distribution with a mean diameter of 2.6 nm to a much wider distribution with a mean diameter of 7.0 nm after the durability test, is shown for ALD Pt/f-C in FIG. 8. This was reflective of the catalyst's large ECSA loss and was the expected behavior for unprotected Pt nanoparticles over voltage cycling.

The initial distribution for 725° C.-10WN shown in FIG. 8 had a mean diameter of 6.3 nm, which showed that thermal treatment resulted in the considerable growth of the Pt nanoparticles from their original size. The durability test only results in a slight shift in the distribution, producing an ADT mean diameter of 7.4 nm. This change in the particle size was statistically significant, but considerably smaller in magnitude than that observed for the unmodified catalyst. Some of the improvement in particle size retention may be attributable to the larger initial mean diameter for 725° C.-10WN, as larger particles do not have as strong of a driving force to minimize surface energy and will be less prone to coalescence. However, analysis of the particle size distributions for commercial Pt/C, which had an initial mean diameter of 5.3 nm—much closer to that of 725° C.-10WN—shows that the Pt nanoparticles in 725° C.-10WN were more stable and retained a smaller ADT mean diameter than Pt/C.

The results provided further evidence of the enhanced stability of the Pt nanoparticles in the 725° C.-10WN catalyst due at least to the steric confinement provided by the stable W/WN nanostructures that were shown to reside in close proximity to the Pt nanoparticles on this catalyst. The presence of these structures inhibited migration and coalescence of the Pt nanoparticles across the carbon surface over potential cycling, though it did not appear to completely eliminate nanoparticle coarsening. Taken alongside the electrochemical durability data reported above, these results demonstrated that WN ALD and subsequent thermal treatment greatly enhance the ORR activity and durability of a previously unremarkable Pt/f-C catalyst.

The provision of a WN enhanced Pt based ORR catalyst and method for making the same according to the embodiments of the disclosure advantageously overcomes the problem of existing ORR catalysts having insufficient activity and/or durability (e.g., as is requisite for use with PEMFCs), by providing a W/WN blocking layer on the surface of a Pt/C substrate, the W/WN blocking layer serving to enhance activity and provide improved durability by stabilizing the Pt nanoparticles amid the W/WN species.

The present disclosure can be embodied in other specific forms without departing from its spirit or essential characteristics. Thus, the described implementations are to be considered in all respects only as illustrative and not restrictive. The scope of the invention is, therefore, indicated by the appended claims rather than by the foregoing description. All changes that come within the meaning and range of equivalency of the claims are to be embraced within their scope.

The invention claimed is:

1. A method of forming an oxygen reduction reaction catalyst comprising:
   providing a carbon supported Pt nanoparticle (Pt/C) substrate;
   applying a tungsten nitride (WN) film onto at least a portion of a surface of the Pt/C substrate;
   oxidizing the Pt/C substrate with the WN film at a first lower temperature;
   annealing the Pt/C substrate with the WN film at a second temperature that is elevated above the first lower temperature in order to reduce WN to metallic tungsten (W) and form a W/WN blocking layer on the Pt/C substrate.

2. The method of claim 1, wherein the providing the Pt/C substrate further comprises performing Pt-$H_2$ atomic layer deposition (ALD) on a functionalized carbon black substrate (ALD Pt/f-C) in order to synthesize the Pt/C substrate.

3. The method of claim 1, wherein a carbon support of the Pt/C substrate comprises carbon black, functionalized carbon black, carbon nanotubes and/or carbon nanofibers.

4. The method of claim 1, wherein the applying the WN film onto at least the portion of the surface of the Pt/C substrate comprises performing ALD of WN onto the Pt/C substrate.

5. The method of claim 4, wherein the performing ALD of WN onto the Pt/C substrate comprises 2 or more cycles of ALD.

6. The method of claim 1, wherein the Pt/C substrate with the WN film comprises at least 1 wt % W prior to the oxidizing and annealing.

7. The method of claim 1, wherein the first lower temperature is at least 150° C. and is applied for at least 1 h in air.

8. The method of claim 1, wherein the second temperature is at least 650° C. and is applied for at least 2.5 h in at least 10% $H_2$ with an inert gas.

9. The method of claim 1, wherein the annealing reduces the WN to the W, such that an amount of nitrogen (N) decreases from a range of about 0.8 to about 1 at % in the Pt/C substrate with the WN film to a range of about 0.25 to about 0.75 at % in the Pt/C substrate with the W/WN blocking layer.

10. The method of claim 1, wherein the annealing increases an average particle size of the Pt/C substrate with the WN film from a range of about 2 to about 3 nm to an average particle size of about 6 to about 8 nm.

11. An oxygen reduction reaction (ORR) catalyst comprising:
   a carbon substrate provided with platinum nanoparticles;
   a blocking layer overlying the carbon substrate,
   wherein the blocking layer comprises tungsten,
   wherein the tungsten of the blocking layer comprises tungsten metal and tungsten nitride.

12. The ORR catalyst of claim 11, wherein the blocking layer has a thickness of at least 10 atomic layers, the blocking layer partly overlying the platinum nanoparticles.

13. An oxygen reduction reaction (ORR) catalyst comprising:
   a carbon substrate provided with platinum nanoparticles;
   a blocking layer overlying the carbon substrate,
   wherein the blocking layer comprises tungsten and has a W:N atomic ratio of greater than 0.5.

14. The ORR catalyst of claim 11, wherein the platinum nanoparticles have a mean particle diameter of at least 5 nm.

15. The ORR catalyst of claim 11, wherein the platinum nanoparticles and the blocking layer comprise separate phases.

16. The ORR catalyst of claim 11, wherein the carbon substrate comprises carbon black, functionalized carbon black, carbon nanotubes, graphene and/or carbon nanofibers.

17. The ORR catalyst of claim 11, wherein the carbon substrate is doped with nitrogen.

18. The ORR catalyst of claim 11, wherein the tungsten metal is more evenly dispersed across a surface of the carbon substrate than the platinum nanoparticles.

19. An oxygen reduction reaction (ORR) catalyst comprising:
   a carbon substrate provided with platinum nanoparticles;
   a blocking layer overlying the carbon substrate,
   wherein the blocking layer comprises tungsten, and
   wherein the ORR catalyst has a composition including about 0.5 to about 1 at % W, about 1.5 to about 2 at % Pt, about 0.25 to about 0.75 at % N, and C.

20. A fuel cell comprising the ORR catalyst of claim 11.

* * * * *